(12) United States Patent
Yang

(10) Patent No.: US 6,235,119 B1
(45) Date of Patent: *May 22, 2001

(54) END POINT WINDOW ASSEMBLY IN AN ETCHING APPARATUS FOR FABRICATING SEMICONDUCTOR DEVICES

(75) Inventor: Dal-Seung Yang, Seoul (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/667,765

(22) Filed: Sep. 22, 2000

Related U.S. Application Data

(63) Continuation of application No. 09/280,585, filed on Mar. 30, 1999, now Pat. No. 6,176,933.

(30) Foreign Application Priority Data

Mar. 30, 1998 (KR) .................................. 98-11032

(51) Int. Cl.⁷ .............................. C23C 16/00; H05H 1/00
(52) U.S. Cl. .................... 118/722; 118/715; 118/712; 118/713; 156/345
(58) Field of Search .................................. 118/722, 715, 118/712, 713; 156/345

(56) References Cited

U.S. PATENT DOCUMENTS

| 4,836,140 | 6/1989 | Koji . |
|---|---|---|
| 5,810,930 | 9/1998 | Eom et al. . |

FOREIGN PATENT DOCUMENTS 60-18265   7/1985   (JP) .

OTHER PUBLICATIONS

Applied Materials CENTURA Metal Etch MxP Chamber Manual, Preliminary Jul. 1995 (5 pages).

*Primary Examiner*—Gregory Mills
*Assistant Examiner*—P. Hassanzadeh

(57) ABSTRACT

An end point window assembly in an etching apparatus includes an end point bracket having an inducing tube connected to an optic cable. The end point bracket is connected to a process chamber of the etching apparatus and a main window is provided to cut off a gap between the optic cable and the process chamber. The end point window assembly further includes at least a spare window insertion groove between the main window and the process chamber about the inner circumference of the inducing tube. A spare window guiding groove corresponding in location to the spare window insertion groove is connected to and tunnelled through an inside of a body of the end point bracket, a spare window is displacably movable between the spare window insertion groove and the window guiding groove wherein the spare quartz window selectively closes the inducing tube, and a moving mechanism for transferring the spare window along the spare window guiding groove in accordance with an extent of contamination of the spare window.

22 Claims, 4 Drawing Sheets

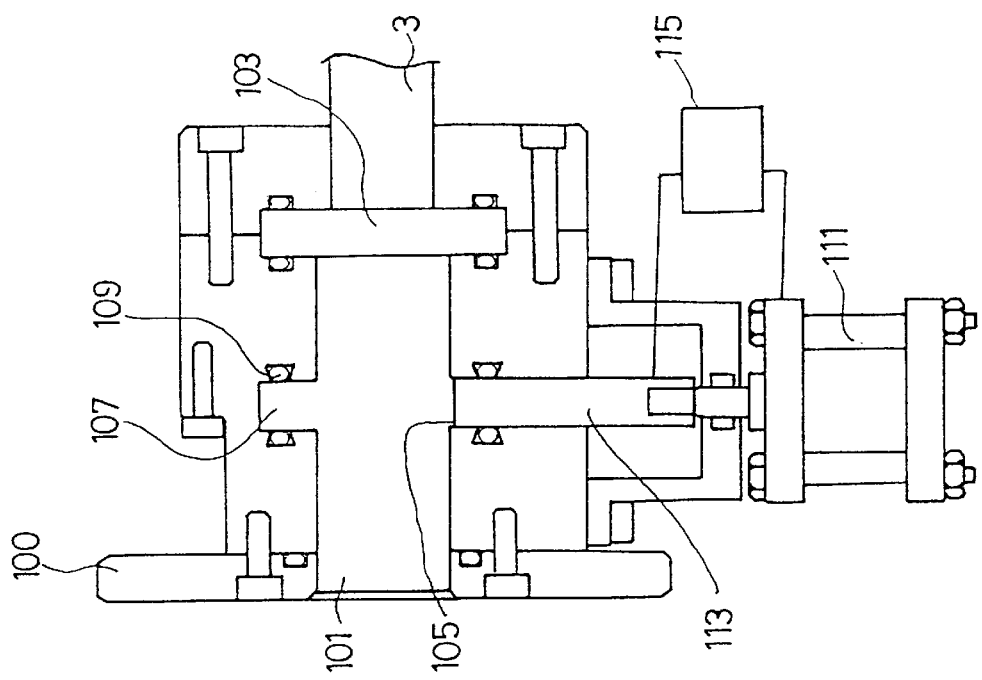
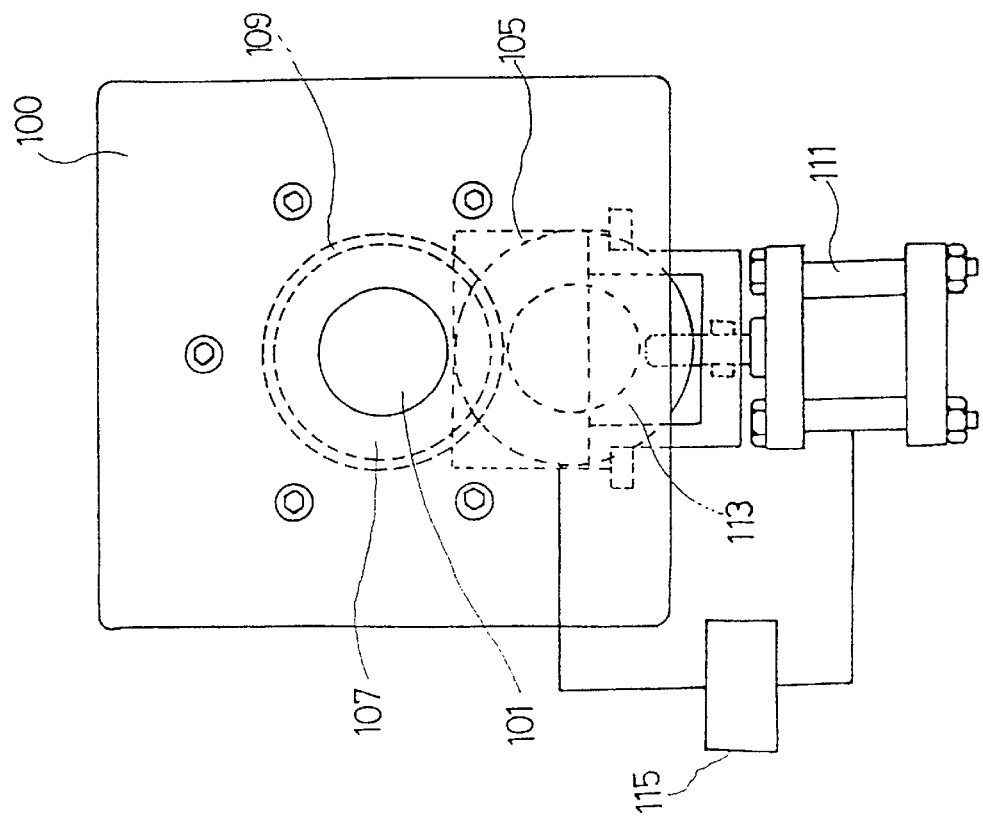

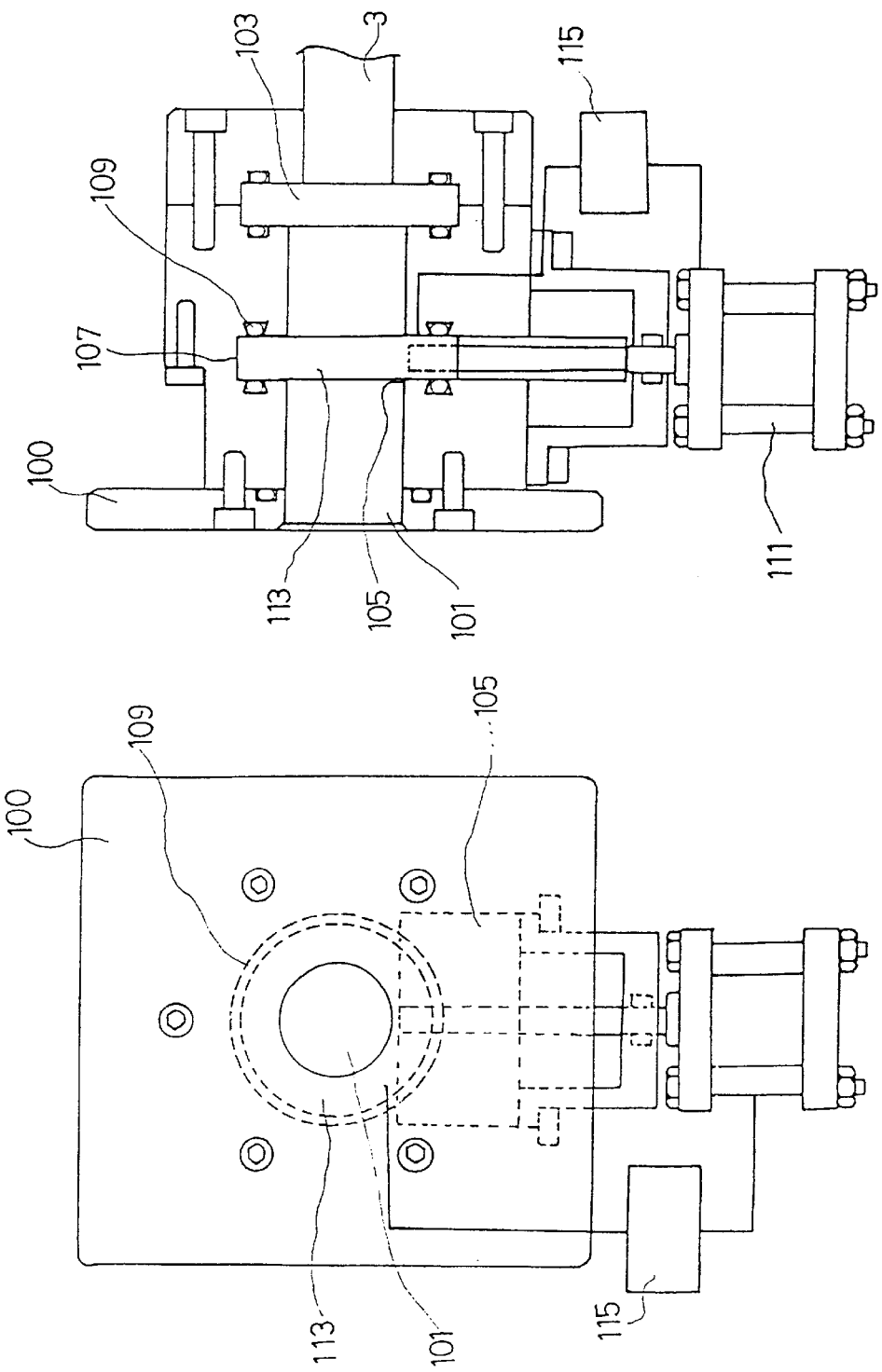

END POINT WINDOW ASSEMBLY IN AN ETCHING APPARATUS FOR FABRICATING SEMICONDUCTOR DEVICES

This application is a continuation of Application Ser. No. 09/280,585, filed on Mar. 30, 1999, now U.S. Pat. No. 6,176,933 the entire contents of which are hereby incorporated by reference.

BACKGROUND OF THE INVENTION

1. Field of Invention

The present invention relates to an end point window assembly in an etching apparatus for fabricating semiconductor devices, more particularly, to a movable spare end point window in an etching apparatus wherein a contaminated end point window is movable so as to be replaced in action by a new window if the spare end point window is sufficiently contaminated by by-products which are generated from reactive rays of plasma gas in a process chamber of the apparatus.

2. Discussion of Related Art

Various methods of etching are used in the fabrication of semiconductor devices. Plasma gas is effective for etching nitride oxide, polycrystalline silicon, and silicon oxide. With plasma gas etchings, an end point detection mechanism for detecting an ending point of an etching process, for informing a worker of the end of etching, and for terminating the etching process is installed in a plasma etch apparatus.

The operational principle of the end point detection mechanism is that each plasma reaction ray generated from the plasma gas has a unique color corresponding to a reaction of the plasma gas with a given film of a process layer on a wafer. Namely, each process layer is clearly identifiable in accordance with colors generated from reactions with each process layer, which are distinguished from one another by spectrum analysis.

Accordingly, in the conventional end point detection mechanism, the etch process is terminated when a unique spectrum corresponding to the last process layer is detected after the spectrums of plasma rays generated from etching the wafer have been analyzed. The end point detection mechanism is connected to a side of a process chamber through a quartz end point window.

FIG. 1 shows an end point detection mechanism according to a conventional art.

Referring to FIG. 1, a wafer is mounted in a process chamber 1. An optic cable 3 transmits plasma reaction rays to a monochromator 5 and is connected to a side of the process chamber 1. An end point window assembly 7 is provided between the process chamber 1 and the optic cable 3 and transmits the plasma reaction rays while blocking passage of reaction by-products. Monochromator 5 analyzes the spectra of the plasma reaction rays and outputs analog signals corresponding thereto. An interface board 9 converts the analog signals into digital signals. The digital signals are then passed to a display 11 where the digital signals are made visible.

The monochromator 5 analyzes, the spectra of the plasma reaction rays incident from the optic cable 3 and includes a diffraction grid 13, a motor 15 rotating the diffraction grid 13 in an arbitrary direction, and a photo multiplier tube 17 for converting the values of the spectra reflected by the diffraction grid 13 into analog signals.

FIG. 2 shows the disassembled parts of the conventional end point window assembly.

Referring to FIG. 2, the end point window, through which the plasma reaction rays enter the end point detection mechanism 2, includes an end point bracket 19 connected to the process chamber 1 and having an inducing tube 21 to which the optic cable 3 is connected. A quartz window 23 which blocks passage of the polymers of by-products generated by the etching process lies between the end point bracket 19 and the process chamber 1. An O-ring 25 is positioned inserted around the quartz window 23 and seals a gap between the quartz window 23 and the process chamber 1. A UV filter 27 is installed on the front (exterior side) of the quartz window 23.

The plasma reaction rays enter the conventional end point detection mechanism 2 in the following manner.

Plasma reaction rays, which are generated from the reactions between a given process layer on a wafer and the plasma gas in the process chamber 1, are transmitted to the end point detection mechanism 2 through the end point window assembly 7 and the optic cable 3. More specifically, having been filtered through UV filter 27 and passed through the quartz window 23, the plasma reaction rays are carried to the optic cable 3 connected to the inducing tube 21 of the end point bracket 19.

The plasma reaction rays incident on the end point detection mechanism 2 undergo spectral analysis by way of the monochromator 5 and then are output as analog signals corresponding to the intensity of the plasma.

Such analog signals are converted into digital signals by the interface board 9 in a known manner. Then, the results of the spectral analyses are shown in the display as a picture.

Accordingly, the etching process in the process chamber is terminated once the spectrum corresponding to the last process layer on the wafer is detected.

However in the conventional art, polymers generated by the etching process attach to and accumulate on the quartz window and form a byproduct layer. This contaminates the quartz window and prevents the plasma reaction rays from being transmitted by the quartz window, thereby making it difficult to determine the exact end point of etch.

Moreover, frequent disassembly and cleaning is necessary to prevent the polymers from accumulating on the end point window according to the conventional art. This causes a high degree of abrasion of parts and tends to damage the fragile quartz window.

SUMMARY OF THE INVENTION

Accordingly, the present invention is directed to an end point window assembly in an etching apparatus that substantially obviates one or more of the above-mentioned problems caused by limitations and disadvantages of the conventional art.

An object of the present invention is to provide an end point window assembly in an etching apparatus which prevents malfunctions caused by accumulated polymers by installing a spare window between a main end point window and a process chamber and by thereafter moving the spare end point window, once contaminated by accumulated polymers, into an end point window bracket so as to not block transmission of plasma reaction rays.

Another object of the present invention is to provide an end point window assembly in an etching apparatus which prevents parts from being damaged because the time interval between times for disassembling and cleaning the apparatus is increased.

Additional features and advantages of the invention will be set forth in the description which follows and in part will be apparent from the description, or may be learned by practice of the infinitives and other advantages of the invention will be realized and attained by the structure particularly pointed out in the written description and claims hereof as well as the appended drawings.

To achieve these and other advantages, and in accordance with the purposes, of the present invention, as embodied and broadly described, the present invention includes an end point bracket including an inducing tube connected to an optic cable, wherein the end point bracket is connected to a process chamber. A main window separates a space between the optic cable and the process chamber. The end point window assembly according to the present invention further includes at least a spare window insertion groove provided between the main window and the process chamber about the inner circumference of the inducing tube, a spare window guiding groove corresponding in location with the spare window insertion groove, wherein the spare window guiding groove communicates with an interior of a body of the end point bracket. A spare window is slidably disposed in the spare window guiding groove, whereby the spare window selectively closes off the inducing tube. A spare window moving mechanism is provided for transferring the spare window along the spare window guiding groove in accordance with an extent of the contamination.

Accordingly, the plasma reaction rays pass through and the by-product polymers are cut off since the gap between the process chamber and the optic cable is sealed up by the spare window selectively moved by the mechanism for transferring the spare window along the insertion groove. In this case, the spare window is installed on a spare window guiding groove. Once positioned, the spare window begins to be contaminated as the polymers accumulate on a surface thereof, which interrupts the transmission of the plasma reaction rays. Accordingly, the contaminated spare window is retracted inside the spare window guiding groove. Thus, the next window cuts off the polymers.

The end point window assembly according to the present invention includes an automated by-products-control part which is connected to an end of the spare window and senses the extent of contamination of the spare window, and an actuator which moves up or down and displaces the spare window according to the values of the auto gain controller.

The polymers are blocked off by a next window as the inducing tube is opened by activating the actuator attached to the spare window. Particularly, the auto gain controller senses the degree of contamination of the spare window, which is selectively positioned between the process chamber and the optic cable and prevents the polymers from accumulating on another window, and then compares the extent of contamination with a selected threshold value.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the inventing and together with the description serve to explain the principle of the invention.

In the drawings:

FIGS. 3A and 4A show side views of the spare window according to the present invention, before and after its operation, respectively; and FIGS. 3B and 4B show front views of the spare window according to the present invention before and after its operation, respectively.

DETAILED DESCRIPTION OF PREFERRED EMBODIMENTS

Figure 1:
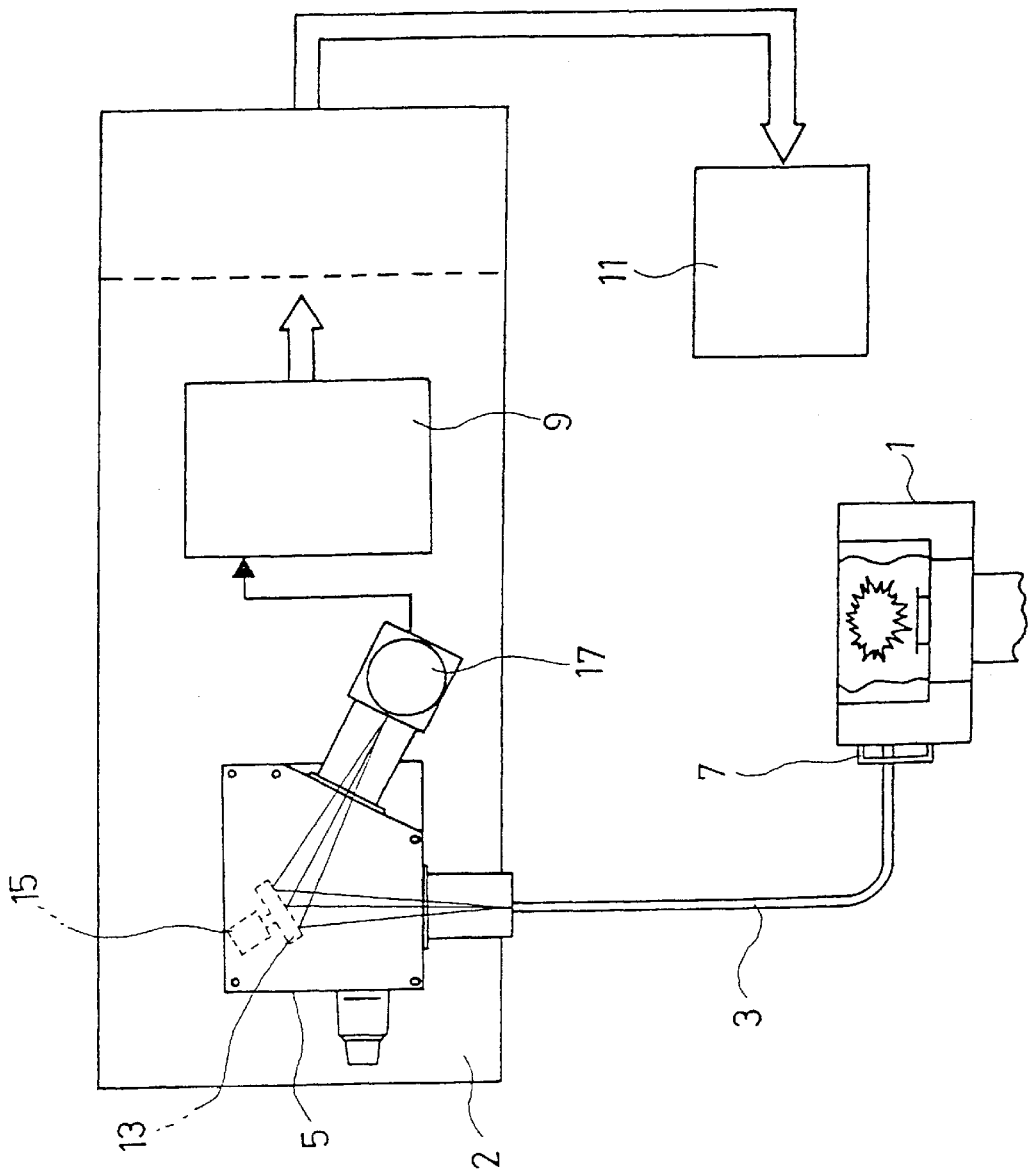
FIG. 1 shows an end point determining mechanism according to the conventional art.
Figure 2:
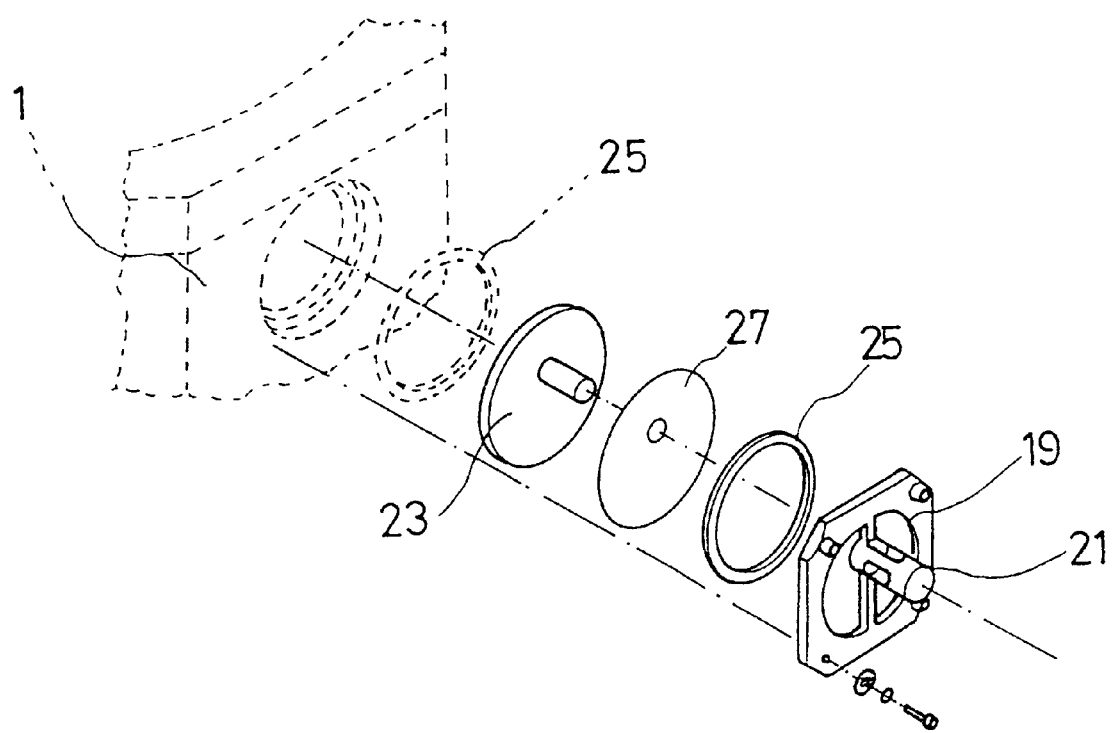
FIG. 2 shows the disassembled parts of the conventional end point window assembly.

Reference will now be made in detail to the preferred embodiments of the present invention, examples of which are illustrated in the accompanying drawings.

FIGS. 3A and 4A show side views of the spare window according to the present invention, before and after its operation, respectively, and FIGS. 3B and 4B show front views of the spare window according to the present invention, before and after its operation, respectively.

Referring to FIG. 3A, an end point bracket 100 is fastened to a side of a process chamber 1 (not shown) in which a wafer is mounted and etched. An inducing tube 101, which communicates with the process chamber 1 and has an end connected to an optic cable 3, is formed in a central part of the end point bracket 100.

A main window 103 is fastened inside the inducing tube 101 (through which the optic cable 3 is inserted), and is perpendicular relative to the inducing tube 101. Thus, the main window 103 seals off the space between the process chamber 1 and the optic cable 3.

A spare window guiding groove 105, which is formed in the inside the body of the end point bracket 100, in communication with an inner circumference of the inducing tube 101, is formed at an intermediate portion of the inducing tube 101. A spare window insertion groove 107 is formed about the inner circumference of the inducing tube 101 at a location corresponding to the spare window guiding groove 105.

A spare window 113, which is displaced up or down by an actuator 111 formed at a side thereof, is movably disposed in the window guiding groove. 105. Spare window 113 (as well as main window 115) may be made from quartz. The spare window 113 is moved by the actuator 111 up along the spare window guiding groove 105 and inserted into the spare window insertion groove 107. Thus, the space between the optic cable 3 and the process chamber 1 is further sealed. In this case, leakage of by-products generated in the process chamber 1 is prevented because the spare window 113 sealingly engages with O-rings 109 in the spare window insertion groove 107.

Once the spare window 113 is contaminated over time by by-products of the etching process, the actuator 111 is activated to move the spare window 113 down into the spare window guiding groove 105 by the measured value of the auto gain controller 115, which senses the by-products accumulated on spare window 113 and is connected to the spare window 113. Thereafter, the by-products are still cut off by the main window 103.

Accordingly, once the spare window 113 is contaminated by the by-products of the etching process, the spare window 113 is opened (i.e., retracted) by the actuator 111 and then the main window 103 continues to act to cut off the by-products generated by the plasma reaction rays. Thus, it is clearly desirable to form a plurality of the spare windows and corresponding actuators in spaced intervals.

The process of opening the spare window(s) in an etch apparatus according to the present invention is as follows.

While the plasma reaction rays generated when etching a wafer enter through the main window 103 at a side of the process chamber 1, the main window 103 is fixed to the inner circumference of the inducing tube 101 (which communicates the optic cable 3 with the end point bracket 100) in order to separate the process chamber 1 and the optic cable 3.

The spare window 113 is additionally installed between the main window 103 and the process chamber 1, and selectively moves back and forth from the spare window guiding groove 105 to the spare window insertion groove 107 to close or to open the inducing tube 101. Accordingly, the by-products generated from wafer etching in the process chamber 1 are cut off by the spare window 113 located close to the process chamber 1 but the plasma reaction rays are properly transmitted to the end point detection mechanism 2 by way of the optic cable 3.

As the by-products accumulate on the spare window 113, auto gain controller 115 senses the degree of contamination thereof. If the extent of the contamination is over a predetermined reference value, then the spare window 113 is retracted into the spare window guiding groove 105 of the inducing tube 101 by activating the actuator 111 connected to the now-contaminated spare window 113.

Thereafter, the by-products are cut off by the main window 103 next to the spare window 113, but the plasma reaction rays are still properly transferred to the optic cable 3. Hence, it is possible to cut off the by-products in multiple stages if a plurality of the spare windows (with corresponding actuators) are installed therein.

Once contaminated by the by-products, a first spare window 113 is replaced by a next spare window. Thus, the plasma reaction rays which are to be transferred to the end point detection mechanism 2 are not blocked by accumulated by-products.

As explained above, the end point window assembly in an etch apparatus according to the present invention prevents the accumulation of polymers which hinder the transmission of plasma reaction rays through the window, so that termination of the etching process can be properly determined. This is achieved by providing at least one movable spare window between the main window and the process chamber.

Moreover, the present invention includes a device for judging the degree of contamination of the spare window, whereby the contaminated spare window is moved by activating the actuator if the contamination exceeds a threshold level.

It will be apparent to those skilled in the art that various modifications and variations can be made in end point windows according to the present invention without departing from the spirit or scope of the inventions. Thus, it is intended that the present invention cover the modifications and variations of this invention provided they come within the scope of the appended claims and their equivalents.

What is claimed is:

1. An end point window assembly adapted to be connected to a process chamber of a plasma etching device, the assembly comprising:

a main body including an inducing tube formed therethrough, wherein a first end of said inducing tube is adapted to be connected to an opening in the process chamber such that said inducing tube communicates with an interior of the process chamber, wherein a second end of said inducing tube is adapted to be operatively connected to an etching end point determining mechanism;

an optically transmitting main window arranged transverse to said inducing tube so as to sealingly separate said first and second ends of said inducing tube;

a movable, optically transmitting spare window arranged transverse to said inducing tube, between said first end and said main window, so as to selectively sealingly separate said first end and said main window; and a sensing device constructed and arranged to determine when said spare window should be moved away from a position where said spare window sealingly separates said first end and said main window.

2. The assembly according to claim 1, wherein said main body includes spare window guiding groove extending transverse to said inducing tube, wherein said spare window is slidably disposed within said spare window guiding groove.

3. The assembly according to claim 2, wherein said main body includes a spare window insertion groove formed about a periphery of an interior of said inducing tube in a location corresponding with said spare window guiding groove, whereby said spare window is movable along said spare window guiding groove so as to be seated in said spare window insertion groove so as to sealingly separate said first end and said main window.

4. The assembly according to claim 3, wherein said spare window insertion groove includes a seal member located on an interior surface thereof so as to enhance a sealing effect of said spare window seating in said spare window insertion groove.

5. The assembly according to claim 1, wherein said sensing device is constructed and arranged to measure a coating formed on said spare window.

6. The assembly according to claim 5, further comprising an actuator device constructed and arranged to selectively move said spare window so as to selectively sealingly separate said first end and said main window, wherein said sensing device is constructed and arranged to actuate said actuator once said coating exceeds a threshold level so as to move said spare window away from a position where said spare window sealingly separates said first end and said main window.

7. The assembly according to claim 6, wherein said actuator device is an electric motor connected to said spare window.

8. The assembly according to claim 5, wherein said sensing device is an auto gain controller.

9. The assembly according to claim 5, comprising a plurality of said spare windows and a corresponding plurality of said actuator devices located between said first end and said main window.

10. The assembly according to claim 9, said plurality of spare windows being spaced apart along an axial length of said inducing tube.

11. The assembly according to claim 1, further comprising an actuator device constructed and arranged to selectively move said spare window so as to selectively sealingly separate said first end and said main window, said sensing device being constructed and arranged to actuate said actuator device when said sensing device determines said spare window should be moved.

12. A plasma etching device comprising:

a process chamber;

an etching end point determining mechanism operatively connected to said process chamber; and an end point window assembly for operatively connecting said process chamber and said etching end point determining mechanism, said assembly comprising:
- a main body including an inducing tube formed therethrough, wherein a first end of said inducing tube is adapted to be connected to an opening in said process chamber such that said inducing tube communicates with an interior of said process chamber, wherein a second end of said inducing tube is adapted to be operatively connected to said etching end point determining mechanism;
- an optically transmitting main window arranged transverse to said inducing tube so as to sealingly separate said first and second ends of said inducing tube;
- a movable, optically transmitting spare window arranged transverse to said inducing tube, between said first end and said main window, so as to selectively sealingly separate said first end and said main window; and
- a sensing device constructed and arranged to determine when said spare window should be moved away from a position where said spare window sealingly separates said first end and said main window.

13. The device according to claim 12, wherein said main body includes a spare window guiding groove extending transverse to said inducing tube, wherein said spare window is slidably disposed within said spare guiding groove.

14. The device according to claim 13, wherein said main body includes a spare window insertion groove formed about a periphery of an interior of said inducing tube in a location corresponding with said spare window guiding groove, whereby said spare window is movable along said spare window guiding groove so as to be seated in said spare window insertion groove so as to sealingly separate said first end and said main window.

15. The device according to claim 13, wherein said spare window insertion groove includes a seal member located on an interior surface thereof so as to enhance a sealing effect of said spare window seating in said insertion groove.

16. The device according to claim 12, further wherein said sensing device is constructed and arranged to measure a coating formed on said spare window.

17. The device according to claim 16, further comprising an actuator device constructed and arranged to selectively move said spare window so as to selectively sealingly separate said first end and said main window, wherein said sensing device is constructed and arranged to actuate said actuator once said coating exceeds a threshold level so as to retract said spare window from being seated in said insertion groove.

18. The device according to claim 17, wherein said actuator device is an electric motor.

19. The device according to claim 17, wherein said assembly comprises a plurality of said spare windows and a corresponding plurality of said actuator devices located between said first end and said main window.

20. The device according to claim 19, said plurality of spare windows being spaced apart along an axial length of said inducing tube.

21. The device according to claim 16, wherein said sensing device is an auto gain controller.

22. The device according to claim 12, further comprising an actuator device constructed and arranged to selectively move said spare window so as to selectively sealingly separate said first end and said main window, said sensing device being constructed and arranged to actuate said actuator device when said sensing device determines said spare window should be moved.

* * * * *